(12) United States Patent
Kim et al.

(10) Patent No.: US 11,695,420 B2
(45) Date of Patent: Jul. 4, 2023

(54) LOGIC-IN-MEMORY INVERTER USING FEEDBACK FIELD-EFFECT TRANSISTOR

(71) Applicant: Korea University Research and Business Foundation, Seoul (KR)

(72) Inventors: Sang Sig Kim, Seoul (KR); Kyoung Ah Cho, Seoul (KR); Jae Min Son, Seongnam-si (KR); Eun Woo Baek, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 160 days.

(21) Appl. No.: 17/411,353

(22) Filed: Aug. 25, 2021

(65) Prior Publication Data

US 2023/0012345 A1    Jan. 12, 2023

(30) Foreign Application Priority Data

Jul. 7, 2021  (KR) .......................... 10-2021-0088865

(51) Int. Cl.
*H01L 29/739*  (2006.01)
*H03K 19/017*  (2006.01)
(Continued)

(52) U.S. Cl.
CPC ... *H03K 19/01714* (2013.01); *H01L 27/0922* (2013.01); *H01L 29/0665* (2013.01); *H03K 19/0013* (2013.01)

(58) Field of Classification Search
CPC ............ H01L 27/0922; H01L 29/0665; H03K 19/0013; H03K 19/01714
See application file for complete search history.

(56) References Cited

U.S. PATENT DOCUMENTS 10,978,487 B2 * 4/2021 El Dirani ........... H03K 19/0013
2009/0140288 A1   6/2009 Lee et al.
(Continued)

FOREIGN PATENT DOCUMENTS

JP         10-6515 A         1/1998
KR   10-1995-0040869 B1      2/1999
(Continued)

OTHER PUBLICATIONS

Taiwanese Office Action dated Oct. 25, 2022, in counterpart Taiwanese Patent Application No. 110131382 (3 Pages in Chinese).
(Continued)

*Primary Examiner* — Kurtis R Bahr
(74) *Attorney, Agent, or Firm* — NSIP Law

(57) ABSTRACT

Disclosed is technology that is driven using a positive feedback loop of a feedback field-effect transistor and is capable of performing a logic-in memory function. The logic-in-memory inverter includes a metal oxide semiconductor field-effect transistor, and a feedback field-effect transistor in which a drain region of a nanostructure is connected in series to a drain region of the metal oxide semiconductor field-effect transistor, wherein the logic-in-memory inverter performs a logical operation is performed based on an output voltage $V_{OUT}$ that changes depending on a level of an input voltage $V_{IN}$ that is input to a gate electrode of the feedback field-effect transistor and a gate electrode of the metal oxide semiconductor field-effect transistor while a source voltage $V_{SS}$ is input to a source region of the nanostructure and a drain voltage $V_{DD}$ is input to a source region of the metal oxide semiconductor field-effect transistor.

10 Claims, 13 Drawing Sheets

(51) Int. Cl.
  *H03K 19/00* (2006.01)
  *H01L 27/092* (2006.01)
  *H01L 29/06* (2006.01)

(56) References Cited

U.S. PATENT DOCUMENTS

| | | | |
|---|---|---|---|
| 2009/0162979 A1 | 6/2009 | Yang et al. | |
| 2013/0257177 A1 | 10/2013 | Jacobson et al. | |
| 2014/0362644 A1 | 12/2014 | Lue et al. | |
| 2018/0374938 A1* | 12/2018 | Park | G06N 3/065 |
| 2022/0058480 A1* | 2/2022 | Park | G06N 3/049 |

FOREIGN PATENT DOCUMENTS

| | | |
|---|---|---|
| KR | 10-2018-0108508 A | 10/2018 |
| KR | 10-2020-0027823 A | 3/2020 |
| KR | 10-2132196 B1 | 7/2020 |
| KR | 10-2206020 B1 | 1/2021 |
| KR | 10-2021-0058436 A | 5/2021 |
| KR | 10-2022-0119875 A | 8/2022 |
| TW | 202042401 A | 11/2020 |

OTHER PUBLICATIONS

Baek, Eunwoo et al., "Logic-In-Memory Inverter Based on a Silicon Nanowire Feedback Field-Effect Transistor", *Ministry of Trade, Industry & Energy and the Korea Semiconductor Research Consortium*, 2021 (pp. 1-5).

Korean Office Action dated Nov. 15, 2022, in counterpart Korean Patent Application No. 10-2021-0088865 (6 Pages in Korean).

* cited by examiner

410

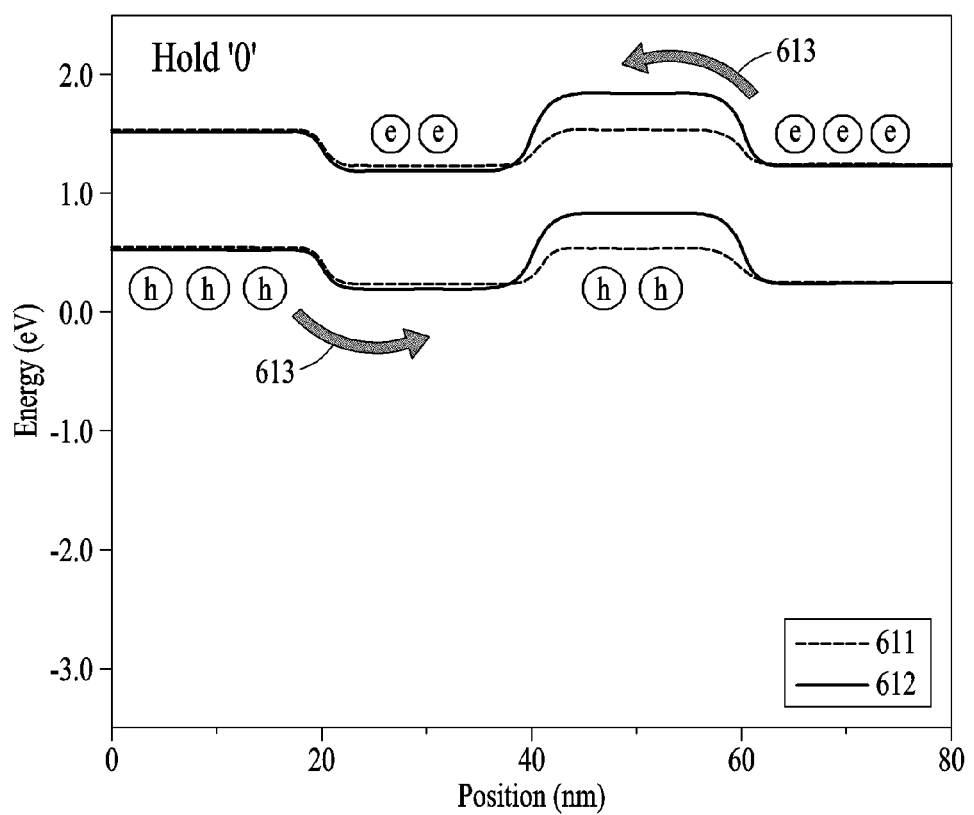

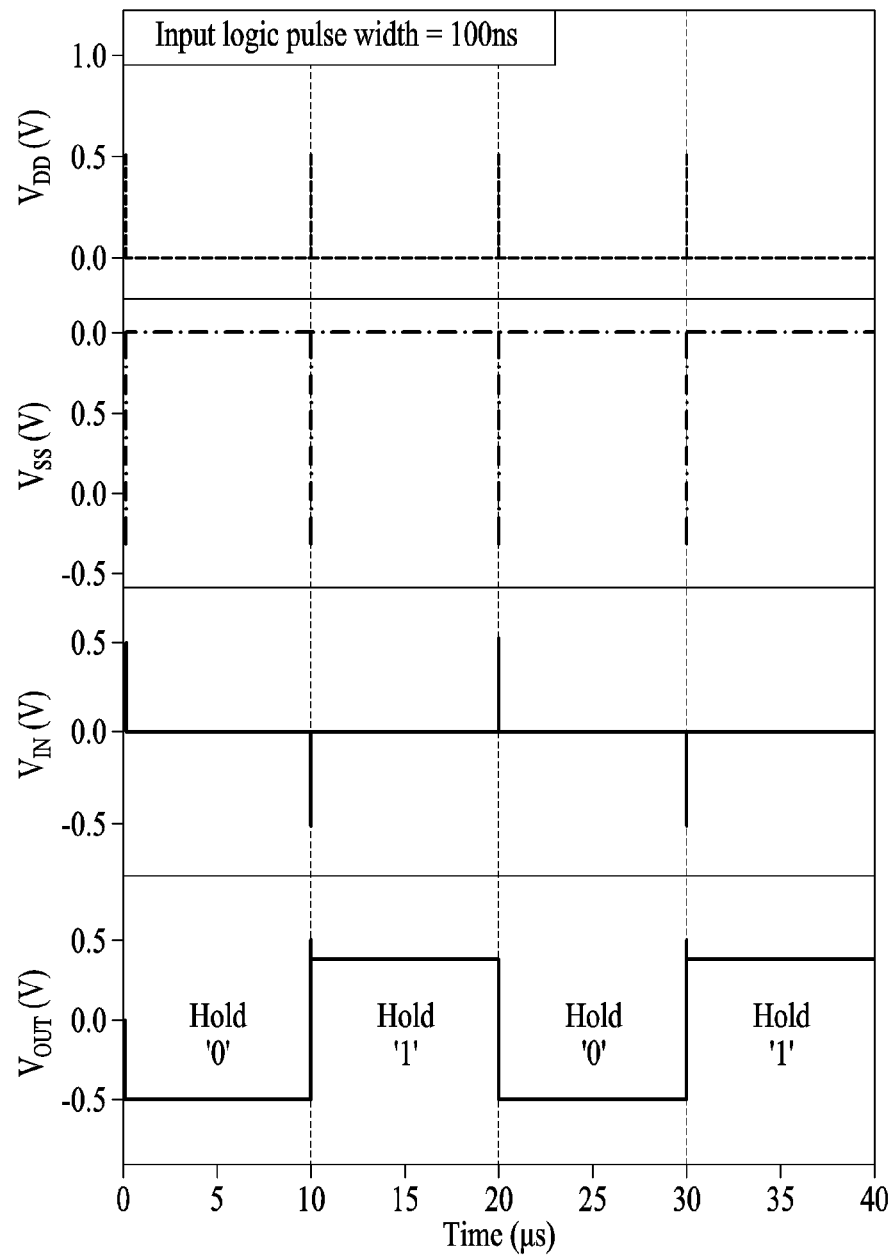

LOGIC-IN-MEMORY INVERTER USING FEEDBACK FIELD-EFFECT TRANSISTOR

CROSS-REFERENCE TO RELATED APPLICATION

This application claims priority to and the benefit of Korean Patent Application No. 10-2021-0088865, filed on Jul. 7, 2021, the disclosure of which is incorporated herein by reference in its entirety.

BACKGROUND OF THE DISCLOSURE

1. Field of the Invention

The present disclosure relates to a logic-in-memory inverter using a feedback field-effect transistor, and more particularly to technology for implementing a logic-in-memory inverter that is driven using a positive feedback loop of a feedback field-effect transistor and is capable of performing a logic-in memory function.

2. Description of the Related Art

A complementary metal-oxide-semiconductor (CMOS) inverter is configured by connecting a p-type metal-oxide-semiconductor field-effect transistor (MOSFET) and an n-type MOSFET in series.

The CMOS inverter is used as a required circuit component for configuring an electronic circuit in an analog integrated circuit and a digital integrated circuit, such as a logic switching circuit, a microprocessor, or a memory.

In an existing von Neumann-based system, a processor and a memory are separated to transmit data through a bus.

However, with an increase in computing performance, a bottleneck phenomenon occurs due to a difference in data processing speed between the processor and the memory, and it begins to reveal a limit in processing a large amount of data.

In other words, the von Neumann-based system, as a revolutionary development in the semiconductor industry, improves the integrated density and performance of modern computers, but disadvantageously consumes a lot of energy and has a long data transmission and latency time due to physical separation between processor and memory layer structures.

In consideration of an increase in data-intensive applications such as 5G communication standards, Internet of Things (IoT), and artificial intelligence (AI), since the $4^{th}$ industrial revolution, a new computing paradigm is required for large-scale data processing.

To overcome the aforementioned problem, research on logic-in memory (LIM) technology obtained by combining arithmetic and memory functions has concentrated and accelerated.

The LIM technology performs the arithmetic function of the processor and the memory function of the memory in the same space, and thus may reduce a delay time and power consumption during data transmission and may significantly improve the integration density of the system.

In the LIM technology, an inverter has been used as a basic component for implementing a logic circuit.

Conventional CMOS-based LIM technology configures a logic circuit with numerous transistors in order to implement a logic-in memory function, and thus an overall area is greatly increased, thereby problematically increasing power consumption.

In addition to research on CMOS-based logic-in memory, research has been conducted into a logic-in memory function using a new element having various materials and structures such as a resistive random-access memory (ReRAM), spin-transfer torque RAM (STT-RAM), or a ferroelectric field-effect transistor (FeFET).

However, these devices are not capable of being applied to a conventional CMOS process, and thus the uniformity and stability of a device are degraded, and it is difficult to use the devices in real life due to complicated processes.

Accordingly, there has been a need to develop technology of a logic circuit for implementing a logic-in memory function using a CMOS process.

CITED REFERENCE

Patent Document

Korean Patent Publication No. 10-2132196, "Feedback field-effect transistor using feedback loop operation and array circuit using the same"
Japanese Patent Laid-Open Publication No. 1998-006515, "Substrate for recording head, recording head using substrate for recording head, and recording device using recording head"
Korean Patent Publication No. 10-2206020, "Ternary memory for logic-in-memory and memory device including the same"
Korean Patent Publication No. 10-0174622, "Structure of bipolar inverter and method of manufacturing the same"

SUMMARY OF THE INVENTION

Therefore, the present disclosure has been made in view of the above problems, and it is an object of the present disclosure to provide a logic-in-memory inverter that is driven using a positive feedback loop of a feedback field-effect transistor and is capable of performing a logic-in memory function.

It is another object of the present disclosure to provide a logic-in-memory inverter including a feedback field-effect transistor and a metal oxide semiconductor field-effect transistor which are based on a CMOS process to achieve an improved integration density.

It is a further object of the present disclosure to provide a logic-in-memory inverter for combining arithmetic and memory functions while improving the processing speed and overcoming the integration limit due to separation of a memory and a processor.

It is another object of the present disclosure to provide a logic-in-memory inverter with increased arithmetic efficiency through switching characteristics while reducing standby power using the memory characteristics of the feedback field-effect transistor.

It is another object of the present disclosure to provide a logic-in-memory inverter that is capable of operating using low power without application of external bias.

It is yet another object of the present disclosure to provide a logic-in-memory inverter for performing a parallel structured data processing method in various fields such as pattern recognition and image analysis while implementing low-power and high-integration density hardware computing.

In accordance with an aspect of the present disclosure, the above and other objects can be accomplished by the provision of a logic-in-memory inverter comprising: a metal oxide semiconductor field-effect transistor; and a feedback field-effect transistor in which a drain region of a nanostructure is connected in series to a drain region of the metal oxide semiconductor field-effect transistor, wherein the logic-in-memory inverter performs a logical operation based on an output voltage $V_{OUT}$ that changes depending on a level of an input voltage $V_{IN}$ that is input to a gate electrode of the feedback field-effect transistor and a gate electrode of the metal oxide semiconductor field-effect transistor while a source voltage VSS is input to a source region of the nanostructure and a drain voltage VDD is input to a source region of the metal oxide semiconductor field-effect transistor.

The logic-in-memory inverter may control a height of a potential barrier in the feedback field-effect transistor depending on the level of the input voltage $V_{IN}$, and as controlling generation of a positive feedback loop depending on the controlled height, the logic-in-memory inverter may maintain a logic state based on the performed logical operation when the source voltage $V_{SS}$, the drain voltage $V_{DD}$, and the input voltage $V_{IN}$ switch to a zero level.

In the feedback field-effect transistor, when the input voltage $V_{IN}$ switches from a low level to a zero level, the height of the potential barrier based on the low level may block electrons and holes injected into a channel region from a drain region and a source region of the nanostructure and an energy level of a drain voltage of the feedback field-effect transistor may be maintained in a high state to maintain a logic state based on the performed logical operation in a high state.

In the feedback field-effect transistor, when the input voltage $V_{IN}$ is at a high level, a positive feedback loop in which electrons and holes are injected into a channel region from a drain region and a source region of the nanostructure may be generated as the height of the potential barrier decreases, and when the input voltage $V_{IN}$ switches from a high level to a zero level, an energy level of a drain voltage of the feedback field-effect transistor may be maintained in a low state to maintain a logic state based on the performed logical operation in a low state based on electrons and holes accumulated in a potential well of the channel region through the positive feedback loop.

In the feedback field-effect transistor, when the input voltage $V_{IN}$ increases to a high level from a zero level, a latch-up phenomenon may occur based on the positive feedback loop.

When the input voltage $V_{IN}$ is at a low level, the logic-in-memory inverter may determine a logic state based on the performed logical operation as a high state; and when the input voltage $V_{IN}$ is at a high level, the logic-in-memory inverter may determine the logic state based on the performed logical operation as a low state.

When the input voltage $V_{IN}$ switches from a low level to a zero level, the logic-in-memory inverter may maintain a logic state based on the performed logical operation in a high state; and when the input voltage $V_{IN}$ switches from a high level to a zero level, the logic-in-memory inverter may maintain the logic state based on the performed logical in a low state.

The metal oxide semiconductor field-effect transistor may be a p-type field-effect transistor; and the feedback field-effect transistor may be an n-type field-effect transistor.

The metal oxide semiconductor field-effect transistor may include a p-n-p transistor including a drain region, a source region, and a channel region, a gate insulating layer, and a gate electrode; the drain region and the source region may be in a p-doped state; and the channel region may be in an n-doped state.

The feedback field-effect transistor may include the nanostructure, a gate insulating layer, and a gate electrode; the nanostructure may be a p-n-p-n nanostructure and may include a drain region, a source region, a first channel region, and a second channel region; the drain region and the second channel region may be in a p-doped state; the source region and the first channel region may be in an n-doped state; and a channel length of the first channel region may be equal to a channel length of the second channel region.

BRIEF DESCRIPTION OF THE DRAWINGS

The above and other objects, features and other advantages of the present disclosure will be more clearly understood from the following detailed description taken in conjunction with the accompanying drawings, in which:

FIGS. 6A and 6B are diagrams for explaining an energy band diagram of a feedback field-effect transistor of a logic-in-memory inverter according to an embodiment of the present disclosure;

FIGS. 8 to 9B are diagrams for explaining a change in output characteristics of a logic-in-memory inverter depending on a supply voltage applied to a logic-in-memory inverter according to an embodiment of the present disclosure.

DETAILED DESCRIPTION OF THE INVENTION

Figure 1:
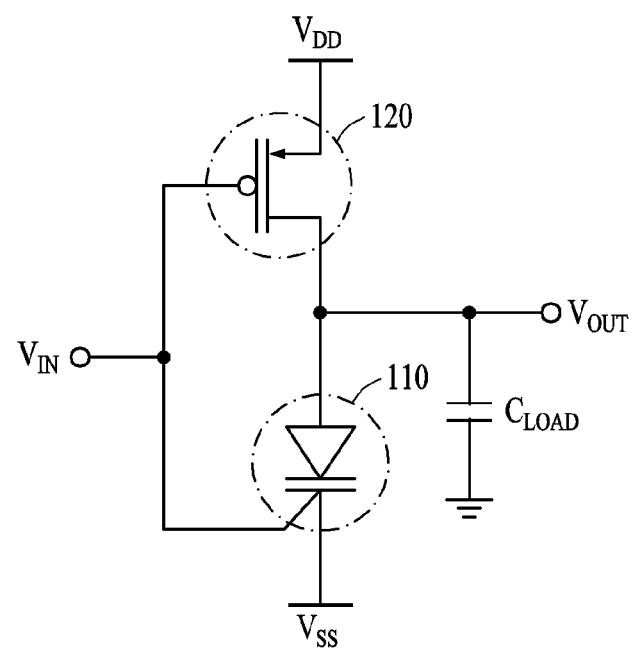
FIG. 1 is a diagram for explaining a circuit diagram for explaining a logic-in-memory inverter according to an embodiment of the present disclosure.

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," " . . . enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

Hereinafter, the terms, such as 'unit' or 'module', etc., should be understood as a unit that processes at least one function or operation and that may be embodied in a hardware manner, a software manner, or a combination of the hardware manner and the software manner.

FIG. 1 is a diagram for explaining a circuit diagram for explaining a logic-in-memory inverter according to an embodiment of the present disclosure.

Referring to FIG. 1, a logic-in-memory inverter 100 according to an embodiment of the present disclosure may include a feedback field-effect transistor 110 and a metal oxide semiconductor field-effect transistor 120.

For example, the logic-in-memory inverter 100 may include the feedback field-effect transistor 110 and the metal oxide semiconductor field-effect transistor 120 which are based on a complementary metal-oxide-semiconductor (CMOS) process.

The logic-in-memory inverter 100 according to an embodiment of the present disclosure may perform not only a logical operation but also a function of memorizing the calculated logic by replacing an n-type metal oxide semiconductor field-effect transistor of a conventional CMOS inverter with the feedback field-effect transistor 110.

In the logic-in-memory inverter 100, a load capacitor $C_{LOAD}$ may be connected to an output end assuming that a parasitic capacitance is present between an output line and a logic gate.

For example, the logic-in-memory inverter 100 may include the feedback field-effect transistor 110 in which a drain region of a nanostructure is connected in series to a drain region of the metal oxide semiconductor field-effect transistor.

The logic-in-memory inverter 100 according to an embodiment of the present disclosure may perform a logical operation based on an output voltage $V_{OUT}$ that changes depending on a level of an input voltage $V_{IN}$ that is input to a gate electrode of the feedback field-effect transistor 110 and a gate electrode of the metal oxide semiconductor field-effect transistor 120 while a source voltage $V_{SS}$ is input to a source region of the feedback field-effect transistor 110 and a drain voltage $V_{DD}$ is input to a source region of the metal oxide semiconductor field-effect transistor 120.

That is, the logic-in-memory inverter 100 may bias the source voltage $V_{SS}$ and the drain voltage $V_{DD}$ using a supply voltage corresponding to source voltages of the feedback field-effect transistor 110 and the metal oxide semiconductor field-effect transistor 120 in order to calculate an output logic state determined by detecting a drain voltage of the feedback field-effect transistor 110.

For example, the output voltage $V_{OUT}$ may be measured at the output end of the logic-in-memory inverter 100 and the input voltage $V_{IN}$ may be input through an input end.

For example, the feedback field-effect transistor 110 may be an n-type field-effect transistor and the metal oxide semiconductor field-effect transistor 120 may be a p-type field-effect transistor.

The configurations of the feedback field-effect transistor 110 and the metal oxide semiconductor field-effect transistor 120 will be further described with reference to FIGS. 2 and 3.

The logic-in-memory inverter 100 according to an embodiment of the present invention may control the height of a potential barrier in the feedback field-effect transistor 110 depending on a level of the input voltage $V_{IN}$.

The logic-in-memory inverter 100 may control generation of a positive feedback loop depending on the height according to the level of the input voltage $V_{IN}$.

Thus, the logic-in-memory inverter 100 may maintain a logic state based on an already performed logical operation when levels of the source voltage $V_{SS}$, the drain voltage $V_{DD}$, and the input voltage $V_{IN}$ switch to a zero level based on the positive feedback loop of the feedback field-effect transistor 110.

According to an embodiment of the present disclosure, the logic-in-memory inverter 100 may perform an operation of a logic-in memory function through feedback operation mechanism of electrons and holes of the feedback field-effect transistor 110.

The logic-in-memory inverter 100 may perform a logic operation and may simultaneously store data by implementing the memory function while maintaining a conventional CMOS logic structure.

Thus, the present disclosure may provide a logic-in-memory inverter for driving the positive feedback loop of the feedback field-effect transistor and being capable of performing the logic-in memory function.

In addition, the present disclosure may provide a logic-in-memory inverter including a feedback field-effect transistor and a metal oxide semiconductor field-effect transistor which are based on a CMOS process to achieve an improved integration density.

Figure 2:
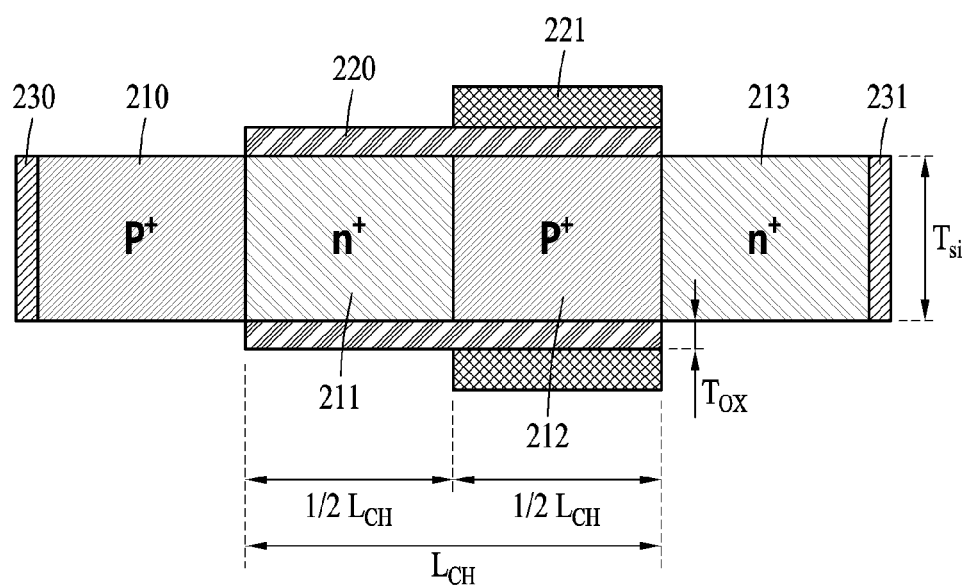
FIG. 2 is a diagram for explaining a feedback field-effect transistor of a logic-in-memory inverter according to an embodiment of the present disclosure.

FIG. 2 is a diagram for explaining a feedback field-effect transistor of a logic-in-memory inverter according to an embodiment of the present disclosure.

Referring to FIG. 2, a feedback field-effect transistor 200 according to an embodiment of the present disclosure may include a nanostructure, a gate insulating layer 220, and a gate electrode 221.

The nanostructure may be a p-n-p-n nanostructure and may include a drain region 210, a source region 213, a first channel region 211, and a second channel region 212.

A drain electrode 230 may be positioned in the drain region 210, and a source electrode 231 may be positioned in the source region 213.

The drain region 210 and the second channel region 212 may be in a p-doped state, and the source region 213 and the first channel region 211 may be in an n-doped state.

The drain region 210, the first channel region 211, and the source region 213 may have a doping concentration of $1\times10^{20}$ cm$^{-3}$, and the second channel region 212 may have a doping concentration of $7\times10^{19}$ cm$^{-3}$.

A channel length ½ $L_{CH}$ of the first channel region 211 may be equal to a channel length ½ $L_{CH}$ of the second channel region 212.

For example, the channel length ½ $L_{CH}$ may be 20 nm, a thickness $T_{Si}$ of the nanostructure may be 10 nm, and a thickness $T_{OX}$ of the gate insulating layer 220 may be 2 nm.

A work function of the gate electrode 221 may be adjusted to 5.65 eV in order to achieve an optimal function in logic and memory operations.

For example, the feedback field-effect transistor 200 may be operated based on a positive feedback loop for adjusting the height of a potential barrier within a channel region.

The feedback field-effect transistor 200 may have steep switching characteristics due to a latch-up phenomenon and excellent memory characteristics controlled by a gate voltage.

The feedback field-effect transistor 200 may be a silicon-based device and may be formed using an existing CMOS process.

Figure 3:
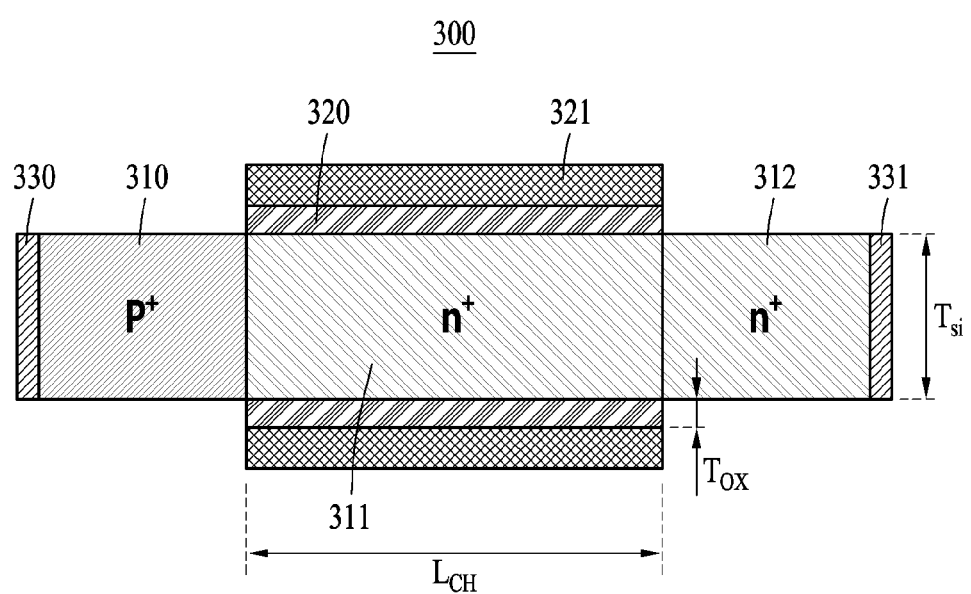
FIG. 3 is a diagram for explaining a metal oxide semiconductor field-effect transistor of a logic-in-memory inverter according to an embodiment of the present disclosure.

FIG. 3 is a diagram for explaining a metal oxide semiconductor field-effect transistor of a logic-in-memory inverter according to an embodiment of the present disclosure.

Referring to FIG. 3, a metal oxide semiconductor field-effect transistor 300 according to an embodiment of the present disclosure may include a p-n-p transistor including a drain region 310, a source region 312, and a channel region 311, a gate insulating layer 320, and a gate electrode 321.

A drain electrode 330 may be positioned in the drain region 310, and a source electrode 331 may be positioned in the source region 312.

The drain region 310 may be in a p-doped state, and the source region 312 and a channel region 211 may be in an n-doped state.

The drain region 310 and the source region 312 may have a doping concentration of $1\times10^{20}$ cm$^{-3}$, and the channel region 311 may have a doping concentration of $7\times10^{19}$ cm$^{-3}$.

The channel length $L_{CH}$ of the channel region 211 may be equal to the sum of channel lengths of the first and second channel regions described above with reference to FIG. 2.

For example, the channel length $L_{CH}$ may be 40 nm, the thickness $T_{Si}$ of the nanostructure may be 10 nm, and the thickness $T_{OX}$ of the gate insulating layer 320 may be 2 nm.

A work function of the gate electrode 321 may be adjusted to 4.8 eV in order to achieve an optimal function in the logic and memory operations.

Figure 4A:
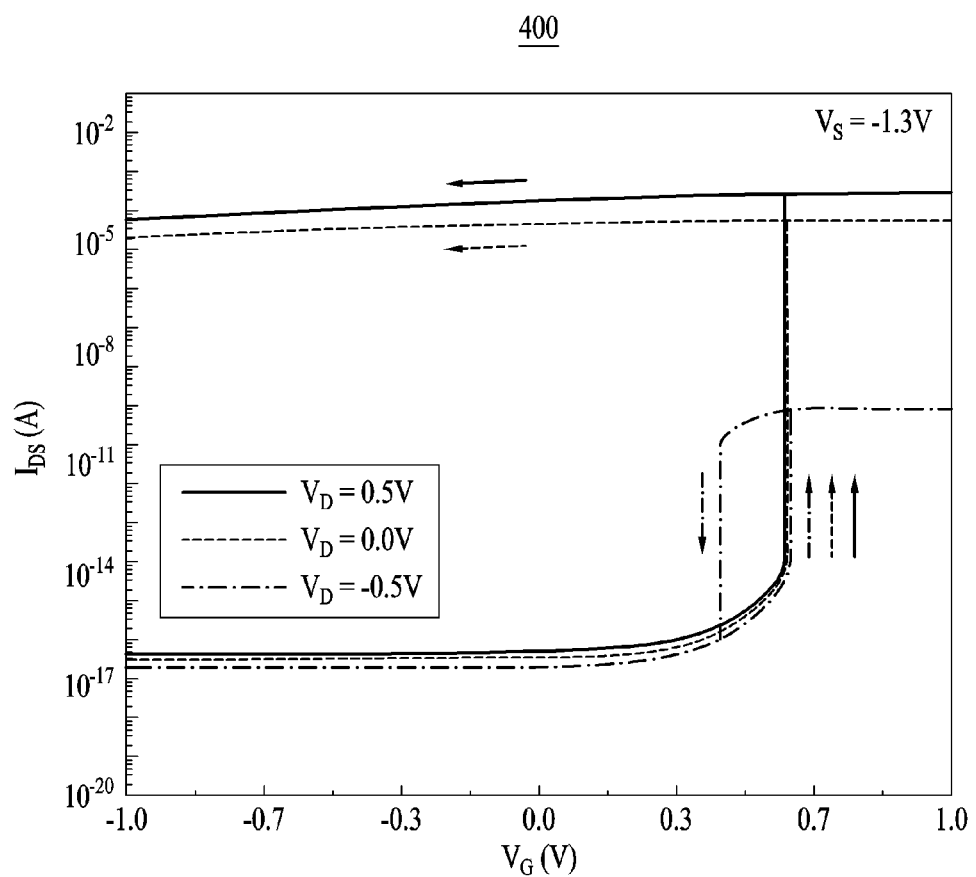
FIGS. 4A and 4B are diagrams for explaining the characteristics of a single device included in a logic-in-memory inverter according to an embodiment of the present disclosure.
Figure 4B:
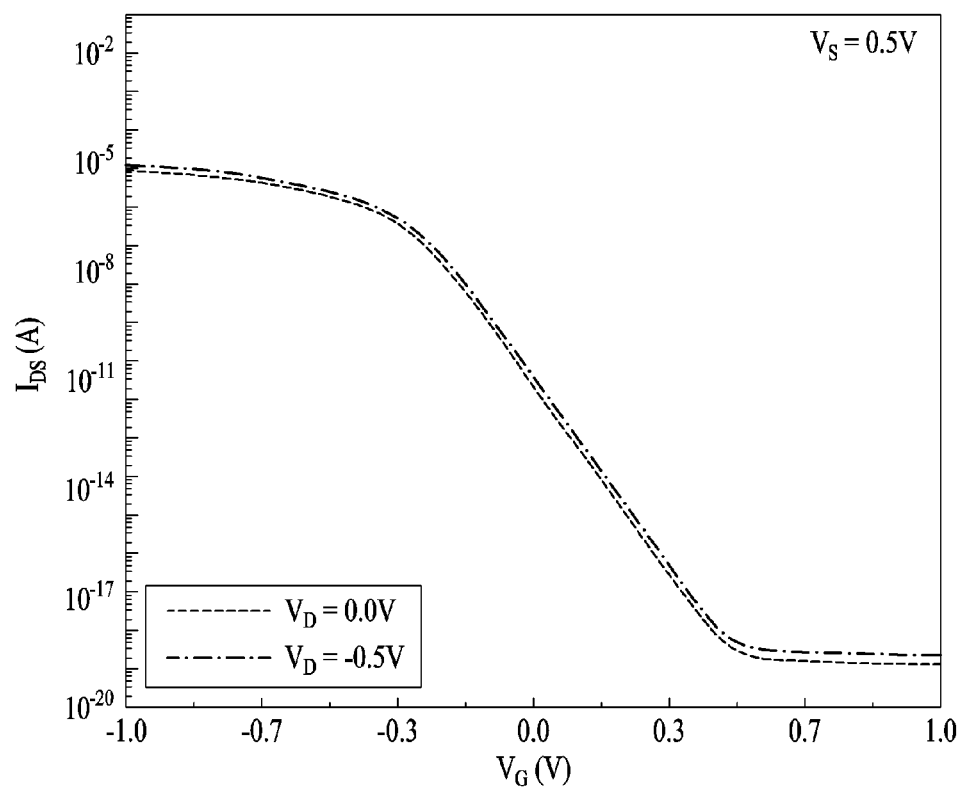

FIGS. 4A and 4B are diagrams for explaining the characteristics of a single device included in a logic-in-memory inverter according to an embodiment of the present disclosure.

In detail, FIG. 4A is a diagram for explaining the characteristics of an operation of a feedback field-effect transistor of a logic-in-memory inverter according to an embodiment of the present disclosure, and FIG. 4B is a diagram for explaining the characteristics of an operation of a metal oxide semiconductor field-effect transistor of a logic-in-memory inverter according to an embodiment of the present disclosure.

Referring to a graph 400 of FIG. 4A, a feedback field-effect transistor of a logic-in-memory inverter according to an embodiment of the present disclosure may have characteristics in which a latch-up phenomenon occurs due to a positive feedback loop with an increase in the gate voltage $V_G$ to have two states.

The latch-up phenomenon may occur during forward sweep of the gate voltage $V_G$, from which it is seen that current $I_{DS}$ sharply increases at a gate voltage $V_G$ equal to or less than 0.6 V.

The feedback field-effect transistor may have a very low sub-threshold swing (SS) of $2.3\times10^{-3}$ mV/dec at a drain voltage $V_D$ of 0.5 V using a positive feedback loop of a channel region, and the latch-up phenomenon may be applied to the logical operation of the logic-in-memory inverter.

The feedback field-effect transistor may switch to an on-state and may show a high on/off current ratio of $10^{12}$.

However, when the gate voltage $V_G$ sweeps in a reverse direction, the current $I_{DS}$ at the gate voltage $V_G$ may decrease in a manner different from the latch-up phenomenon, which is referred to as a latch-down phenomenon, and after the latch-down phenomenon, the feedback field-effect transistor may switch to an off-state.

An interval of the gate voltage $V_G$ at which the latch-up and latch-down phenomena occur may represent a memory window in which on/off states of the feedback field-effect transistor are maintained before the phenomena occurs again.

When more bias is applied to the drain voltage $V_D$, an on/off current ratio and a memory window may increase, but the gate voltage $V_G$ for latch-up phenomena may not be affected.

According to an embodiment of the present disclosure, in the feedback field-effect transistor, when a level of an input voltage $V_{IN}$ increases to a high level from a low level, a latch-up phenomenon based on a positive feedback loop may occur.

Referring to a graph 410 of FIG. 4B, a metal oxide semiconductor field-effect transistor of a logic-in-memory inverter according to an embodiment of the present disclosure may have a threshold voltage at the gate voltage $V_G$ equal to or greater than 0 V and may have characteristics in which drain current increases with a decrease in the gate voltage.

That is, the graph 410 shows an example of an absolute value of current $I_{DS}$ to a gate voltage $V_G$ with respect to the metal oxide semiconductor field-effect transistor.

When the gate voltage $V_G$ of the metal oxide semiconductor field-effect transistor decreases, an absolute value of the current $I_{DS}$ may become close to a saturation region at the gate voltage $V_G$ of −0.5 V.

Despite a high current on/off ratio equal to or less than $10^{15}$, the metal oxide semiconductor field-effect transistor may represent sub-threshold swing (SS) equal to or greater than 60 mV/dec due to the operation mechanism of heat injection.

That is, the logic-in-memory inverter according to an embodiment of the present disclosure may perform a logical operation and a memory function based on the characteristics of the feedback field-effect transistor and the metal oxide semiconductor field-effect transistor.

Accordingly, the present disclosure may provide a logic-in-memory inverter with increased arithmetic efficiency through switching characteristics while reducing standby power using the memory characteristics of the feedback field-effect transistor.

Figure 5A:
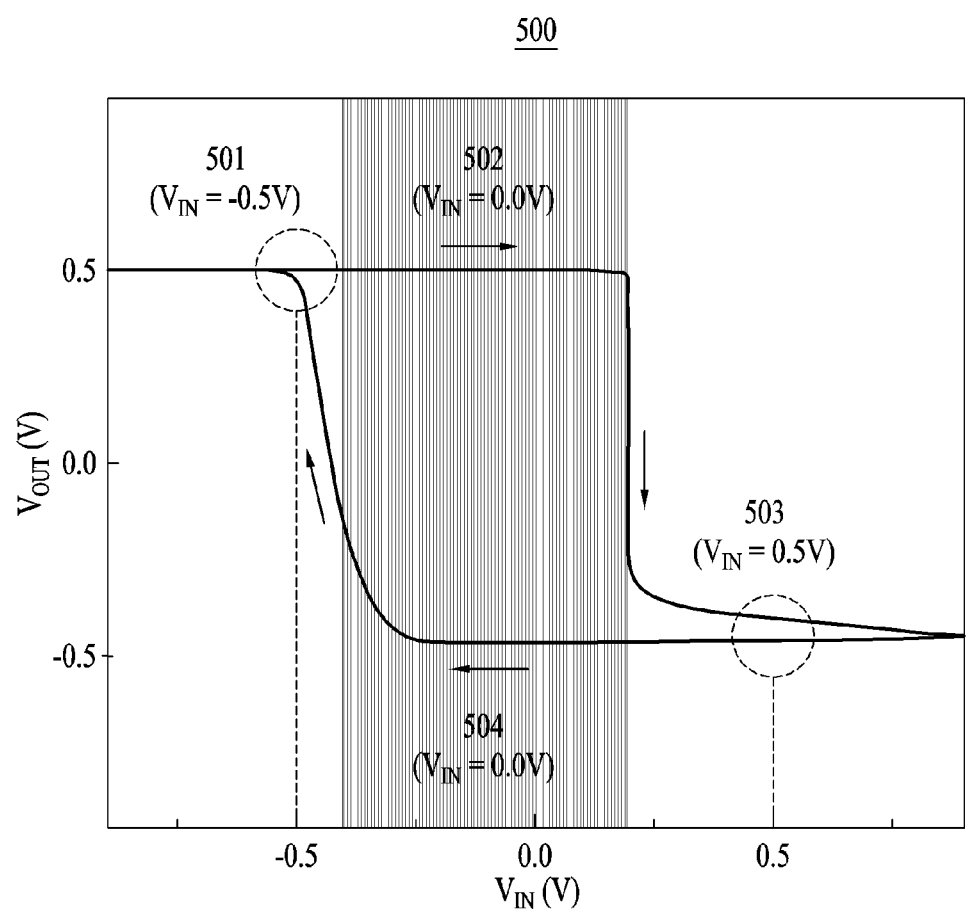
FIG. 5A is a diagram for explaining voltage transfer characteristics of a logic-in-memory inverter according to an embodiment of the present disclosure.

FIG. 5A is a diagram for explaining voltage transfer characteristics of a logic-in-memory inverter according to an embodiment of the present disclosure.

Referring to a graph 500 of FIG. 5A, due to the memory characteristics of the feedback field-effect transistor, the logic-in-memory inverter according to an embodiment of the present invention may maintain a previous logic operation value when the input voltage is at a zero level and logic transition may occur due to different input voltages.

The graph 500 shows an example of voltage transfer characteristics when the drain voltage $V_{DD}$ and the source voltage $V_{SS}$ of supply voltage are 0.5 V and −1.3 V, respectively.

When an output logic state 501 is a high state '1', if an input voltage $V_{IN}$ is applied to a low level of −0.5 V, a high voltage value may be obtained.

When an output logic state 503 is a low state '0', if the input voltage $V_{IN}$ is applied to a high level of 0.5 V, a low voltage value may be obtained.

Differently from an existing CMOS logic inverter, the logic-in-memory inverter according to an embodiment of the present disclosure may have hysteresis characteristics, that is, may switch from an output logic state at different input voltages $V_{IN}$.

The logic-in-memory inverter according to an embodiment of the present disclosure may provide a memory function of containing logic data at a zero level at which the input voltage $V_{IN}$ is 0 V.

In other words, an output logic state 502 and an output logic state 504 may be determined depending on a logic state processed at a zero level at which the input voltage $V_{IN}$ is 0 V, and thus a previous logic state may be maintained.

In the logic-in-memory inverter according to an embodiment of the present disclosure, when the input voltage $V_{IN}$ is at a low level, a logic state based on a logical operation may be determined to be a high state, and when the input voltage $V_{IN}$ is at a high level, the logic state based on the logical operation may be determined to be a low state.

For example, when the input voltage $V_{IN}$ switches from a low level to a zero level, the logic-in-memory inverter may maintain the logic state based on the logical operation in a high state, and when the input voltage $V_{IN}$ switches from a high level to a zero level, the logic-in-memory inverter may maintain the logic state based on the logical operation in a low state.

Figure 5B:
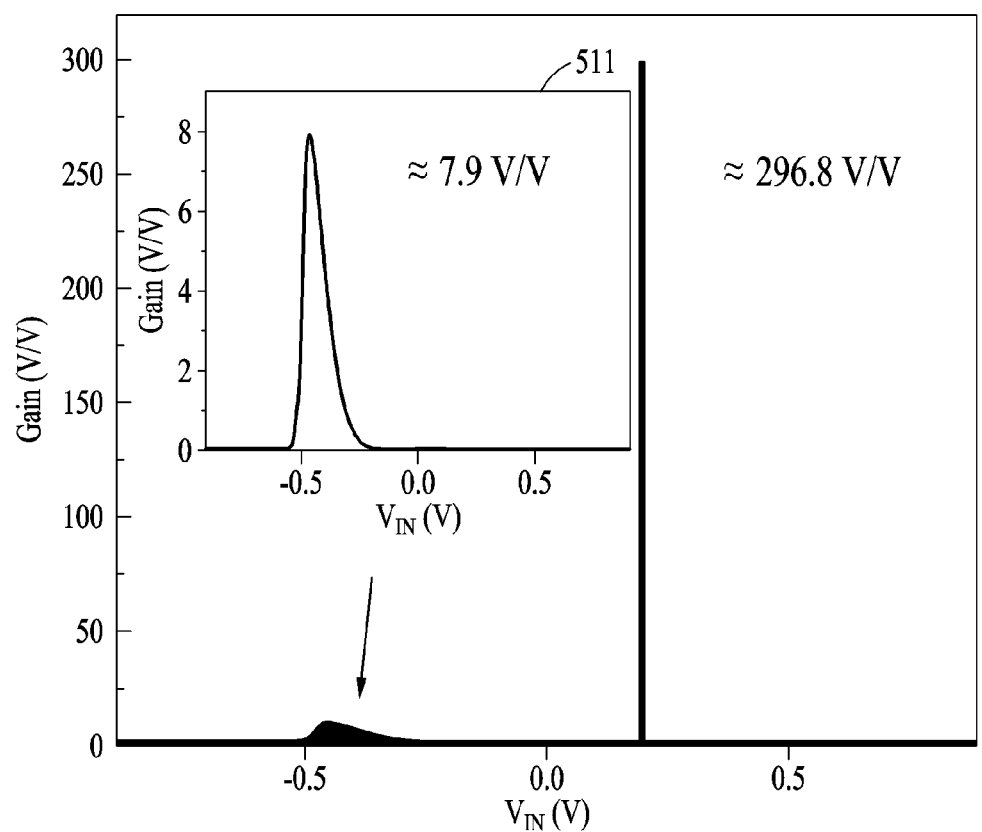
FIG. 5B is a diagram for explaining a gain of a logic-in-memory inverter according to an embodiment of the present disclosure.

FIG. 5B is a diagram for explaining a gain of a logic-in-memory inverter according to an embodiment of the present disclosure.

Referring to a graph 510 of FIG. 5B, a logic-in-memory inverter according to an embodiment of the present disclosure may have a high inverter gain value due to steep switching characteristics of a feedback field-effect transistor.

In detail, the graph 510 shows an example of an inverter gain obtained from an absolute value of a differential value between the input voltage $V_{IN}$ and the output voltage $V_{OUT}$.

Referring to a magnified graph 511 in the graph 510, when a metal oxide semiconductor field-effect transistor is turned on, a logic state of the logic-in-memory inverter may be converted into a high state '1' from a low state '0', and a relatively low inverter gain of about 7.9 V/V may be observed due to SS equal to or greater than 60 mV/dec.

It may be seen that, when the logic state is rapidly converted into the low state '0' from the high state '1', a high gain equal to or less than 296.8 V/V is generated due to a latch-up phenomenon of the feedback field-effect transistor.

That is, the logic-in-memory inverter according to an embodiment of the present disclosure may operate in a narrow input voltage $V_{IN}$ range by ensuring a sufficient voltage margin for operating a memory.

Figure 6A:
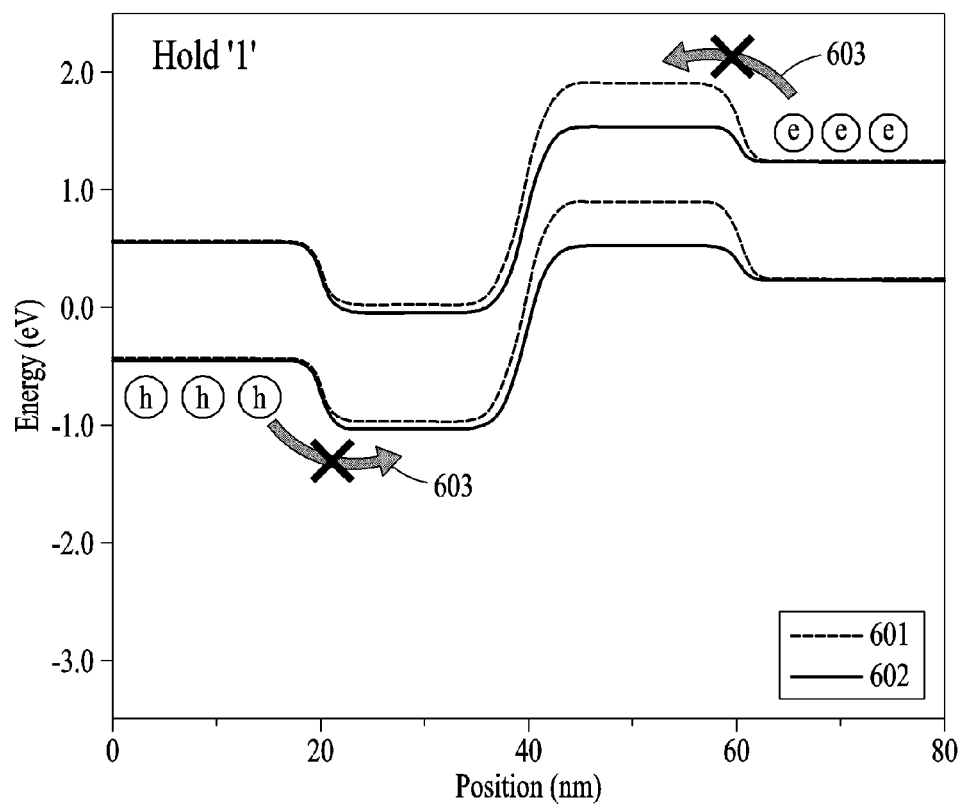

FIGS. 6A and 6B are diagrams for explaining an energy band diagram of a feedback field-effect transistor of a logic-in-memory inverter according to an embodiment of the present disclosure.

FIG. 6A shows an example of characteristics in which a potential barrier of a feedback field-effect transistor blocks electrons and holes injected from drain and source regions and maintains a drain voltage of the feedback field-effect transistor when an output logic state is a high state.

A potential well and barrier in the feedback field-effect transistor may be controlled depending on an input voltage.

When an input voltage is at a low level, an output logic state 601 may be a high state, and when the input voltage switches to a zero level, an output logic state 602 may be maintained in a high state.

In detail, when the output logic state 601 is a high state, a potential barrier may be generated in a channel region of the feedback field-effect transistor, and a positive feedback loop 603 may not be generated in the energy band diagram.

As the input voltage increases to a zero level from a low level, the height of a barrier in a conduction band of the feedback field-effect transistor may be reduced.

However, the potential barrier may be sufficiently high when an input voltage is at a zero level, and thus may prevent electrons and holes from being injected into the channel region.

Accordingly, an energy level of a drain region of the feedback field-effect transistor may be maintained at a level corresponding to hold '1'.

In other words, in the feedback field-effect transistor, when an input voltage switches from a low level to a zero level, the height of the potential barrier based on the low level may block electrons and holes injected into the channel region from drain and source regions of the nanostructure.

Thus, the feedback field-effect transistor may maintain a logic state based on a previously performed logical operation in a high state as the energy level of the drain voltage is maintained in a high state.

For example, the case in which an input voltage is at a low level may correspond to −0.5 V, and the case in which the input voltage is at a zero level may correspond to 0 V.

FIG. 6B shows an example of characteristics in which electrons and holes are injected from drain and source regions and a positive feedback loop is generated due to reduction in the height of a potential barrier with an increase in an input voltage when an output logic state is a low state.

A potential well and barrier in the feedback field-effect transistor may be controlled depending on an input voltage.

When an input voltage is at a high level, an output logic state 611 may be a low state, and when the input voltage switches to a zero level, an output logic state 612 may be maintained in a low state.

In detail, in the feedback field-effect transistor, when the output logic state 611 is a low state, a positive feedback loop 613 in which electrons and holes are injected into a channel region from drain and source regions may be generated as the height of the potential barrier decreases.

In other words, the positive feedback loop 613 may be generated while the height of a barrier decreases with an increase in an input voltage and electrons and holes are injected into a channel region, the electrons and holes accumulated in the channel region may induce an additional decrease in the height of the barrier, and this iterative action may break down the potential barrier and may activate the positive feedback loop 613.

As the input voltage decreases to a zero level from a high level, the height of the barrier in the conduction band of the feedback field-effect transistor may increase with a decrease to the zero level.

However, carriers accumulated in the potential well interrupt regeneration of the potential barrier, and thus an energy level of a drain region corresponding to hold '0' may be maintained.

In other words, even if a level of an input voltage switches from a high level to a zero level, the feedback field-effect transistor may maintain a logic state based on an already performed logical operation in a low state as an energy level of a drain voltage of the feedback field-effect transistor is maintained in a low state based on the electrons and holes accumulated in a potential well of the channel region through the positive feedback loop 613.

For example, the case in which an input voltage is at a high level may correspond to 0.5 V, the case in which the input voltage is at a low level may correspond to −0.5 V, and the case in which the input voltage is at a zero level may correspond to 0 V.

Figure 7:
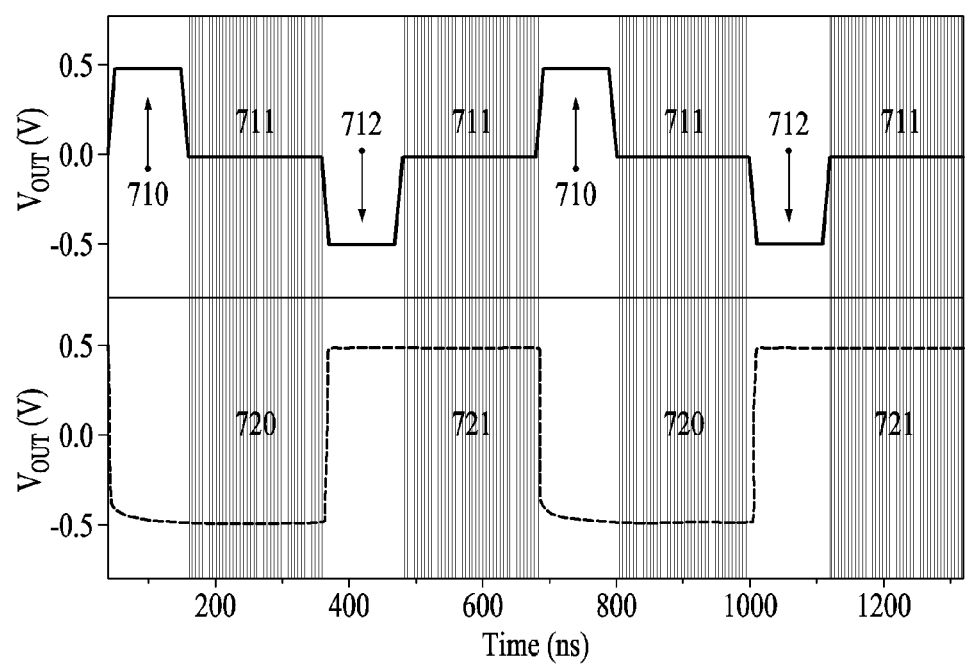
FIG. 7 is a diagram for explaining a change in output characteristics of a logic-in-memory inverter depending on an input pulse applied to a logic-in-memory inverter according to an embodiment of the present disclosure.

FIG. 7 is a diagram for explaining a change in output characteristics of a logic-in-memory inverter depending on an input pulse applied to a logic-in-memory inverter according to an embodiment of the present disclosure.

A graph 700 of FIG. 7 is a timing chart showing a change in output characteristics depending on an applied input voltage of a logic-in-memory inverter.

As seen from the graph 700 of FIG. 7, the logic-in-memory inverter maintains a constant logic voltage value without reduction in voltage and has logical processes and storage capabilities of a proposed inverter within a voltage range of −0.5 V to 0.5 V for 100 ns in a corresponding supply voltage condition.

Referring to the graph 700 of FIG. 7, the logic-in-memory inverter may calculate an output voltage by inverting an input voltage and may maintain the calculated output voltage when an input voltage is not applied.

In detail, the logic-in-memory inverter may output the output voltage at a low level 720 when the input voltage is at a high level 710.

The logic-in-memory inverter may maintain the output voltage at the low level 720 when the input voltage is at a zero level 711.

The logic-in-memory inverter may output the output voltage at a high level 721 when the input voltage is at a low level 712.

The logic-in-memory inverter may maintain the output voltage at the high level 721 when the input voltage is at the zero level 711.

For example, a low level of the input voltage may correspond to −0.5 V, a zero level may correspond to 0 V, and a high level may correspond to 0.5 V.

Figure 9A:
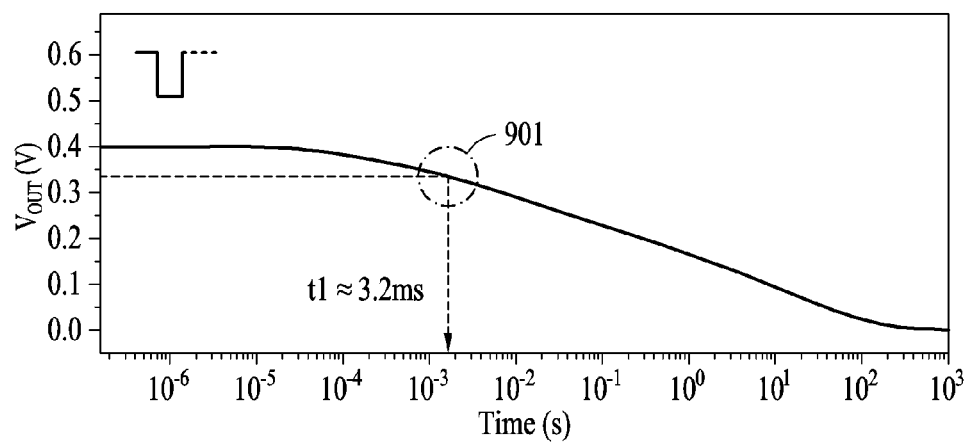
Figure 9B:
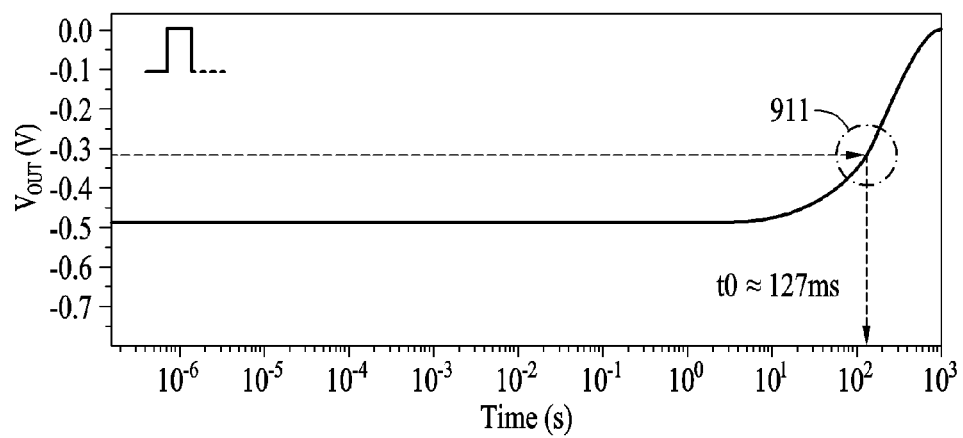

FIGS. 8 to 9B are diagrams for explaining a change in output characteristics of a logic-in-memory inverter depending on a supply voltage applied to a logic-in-memory inverter according to an embodiment of the present disclosure.

FIGS. 8 to 9B show an example of characteristics in which a logic-in-memory inverter according to an embodiment of the present disclosure performs a logical operation when a supply voltage and an input voltage are applied and memorizes a previously calculated logic state for a predetermined time when the input voltage and the supply voltage are removed due to electrons and holes accumulated in a feedback field-effect transistor.

Referring to a graph 800 of FIG. 8, a drain voltage $V_{DD}$ and a source voltage $V_{SS}$ may be input with the same pulse width as a pulse of an input voltage to a logic-in-memory inverter.

A low state or a high state that are maintained for 10 μs after a logic-in-memory inverter according to an embodiment of the present disclosure processes an output logical operation may be maintained in a zero bias state ($V_{IN}=V_{DD}=V_{SS}=0.0$ V).

For example, when an input voltage is at a low level and the drain voltage $V_{DD}$ and the source voltage $V_{SS}$ of 0.5 V and −1.3 V are applied for 100 ns, the logic-in-memory inverter may calculate the output logic state as a high state.

When the supply voltages $V_{DD}$ and $V_{SS}$ are removed, the output voltage $V_{OUT}$ may slightly decrease and may be affected by current through the metal oxide semiconductor field-effect transistor.

Nevertheless, a potential barrier of the feedback field-effect transistor prevents electrons and holes from being further injected, and thus the output logic state may be maintained constant during hold '1'.

Then, the logic-in-memory inverter may switch from a high state to a low state and may calculate the output logic state when the input voltage is at a high level and the drain voltage $V_{DD}$ and the source voltage $V_{SS}$ of 0.5 V and −1.3 V are applied for 100 ns.

Then, in the logic-in-memory inverter, electrons and holes corresponding to charge carriers are accumulated in a channel region of a feedback field-effect transistor, and thus a low logic state may maintain a positive feedback loop in a constant state, and the logic-in-memory inverter may maintain data without voltage supply.

The logic-in-memory inverter may be advantageous in that static power consumption during a holding operation is 0 and an alternative peripheral circuit for operating as a memory circuit is not required.

Accordingly, the present disclosure may provide a logic-in-memory inverter that is capable of operating using low power without application of external bias.

The present disclosure may provide a logic-in-memory inverter for performing a parallel structured data processing method in various fields such as pattern recognition and image analysis while implementing low-power and high-integration density hardware computing.

A graph 900 of FIG. 9A and a graph 910 of FIG. 9B show an example of an output $V_{OUT}$ value of a time function after a logic state for 100 ns is calculated in order to check a range in which a logic-in-memory inverter according to an embodiment of the present disclosure is capable of being maintained in a zero bias state ($V_{IN}=V_{DD}=V_{SS}=0.0V$).

As the time increases to 1000 s, the output $V_{OUT}$ may gradually approach zero voltage during the holding operation and may affect continuous leakage current flowing through a circuit.

Referring to the graph 900 of FIG. 9A and the graph 910 of FIG. 9B, the time at which the output $V_{OUT}$ increases to 63% of an initial value and may be indicated as t0 and t1 with respect to logic states '0' and '1', respectively.

The output $V_{OUT}$ that is 63% of the initial logic state '1' at a point 901 may be measured at about 3.4 ms, and t1 may be measured as 3.4 ms.

It takes much longer to lose the logic state '0' stored in the logic state '0' at a point 911, and thus t0 may be identified as about 127 seconds.

Based on channel carriers accumulated in the channel region of the feedback field-effect transistor, it takes a substantially long t0 over 100 seconds in the logic state '0'.

For example, t0 and t1 may represent the time when the output $V_{OUT}$ reaches 63% of the initial voltage of the output logic states '0' and '1' during the holding operation.

As a result, the logic-in-memory inverter according to an embodiment of the present disclosure may store more than 63% of output logic voltage within 127 seconds (3.4 ms) for high state and low states, which are logic states, without consuming static power.

Accordingly, the present disclosure may provide a logic-in-memory inverter for combining arithmetic and memory functions while improving the processing speed and overcoming the integration limit due to separation of a memory and a processor.

The present disclosure may provide a logic-in-memory inverter that is driven using a positive feedback loop of a feedback field-effect transistor and is capable of performing a logic-in memory function.

The present disclosure may provide a logic-in-memory inverter including a feedback field-effect transistor and a metal oxide semiconductor field-effect transistor which are based on a CMOS process to achieve an improved integration density.

The present disclosure may provide a logic-in-memory inverter for combining arithmetic and memory functions while improving the processing speed and overcoming the integration limit due to separation of a memory and a processor.

The present disclosure may provide a logic-in-memory inverter with increased arithmetic efficiency through switching characteristics while reducing standby power using the memory characteristics of the feedback field-effect transistor.

The present disclosure may provide a logic-in-memory inverter that is capable of operating using low power without application of external bias.

The present disclosure may provide a logic-in-memory inverter for performing a parallel structured data processing method in various fields such as pattern recognition and image analysis while implementing low-power and high-integration density hardware computing.

In the aforementioned embodiments, constituents of the present disclosure were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms.

In other words, it should be understood that plural constituents may be a singular constituent or a singular constituent may be plural constituents.

While the embodiments of the present disclosure have been described, those skilled in the art will appreciate that many modifications and changes can be made to the present disclosure without departing from the spirit and essential characteristics of the present disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

What is claimed is:

1. A logic-in-memory inverter comprising:
a metal oxide semiconductor field-effect transistor; and
a feedback field-effect transistor in which a drain region of a nanostructure is connected in series to a drain region of the metal oxide semiconductor field-effect transistor,
wherein the logic-in-memory inverter performs a logical operation based on an output voltage $V_{OUT}$ that changes depending on a level of an input voltage $V_{IN}$ that is input to a gate electrode of the feedback field-effect transistor and a gate electrode of the metal oxide semiconductor field-effect transistor while a source voltage $V_{SS}$ is input to a source region of the nanostructure and a drain voltage $V_{DD}$ is input to a source region of the metal oxide semiconductor field-effect transistor.

2. The logic-in-memory inverter according to claim 1, wherein the logic-in-memory inverter controls a height of a potential barrier in the feedback field-effect transistor depending on the level of the input voltage $V_{IN}$, and as controlling generation of a positive feedback loop depending on the controlled height, the logic-in-memory inverter maintains a logic state based on the performed logical operation when the source voltage $V_{SS}$, the drain voltage VDD, and the input voltage $V_{IN}$ switch to a zero level.

3. The logic-in-memory inverter according to claim 2, wherein, in the feedback field-effect transistor, when the input voltage $V_{IN}$ switches from a low level to a zero level, the height of the potential barrier based on the low level blocks electrons and holes injected into a channel region from a drain region and a source region of the nanostructure and an energy level of a drain voltage of the feedback field-effect transistor is maintained in a high state to maintain a logic state based on the performed logical operation in a high state.

4. The logic-in-memory inverter according to claim 2, wherein, in the feedback field-effect transistor, when the input voltage $V_{IN}$ is at a high level, a positive feedback loop in which electrons and holes are injected into a channel region from a drain region and a source region of the nanostructure is generated as the height of the potential barrier decreases, and when the input voltage $V_{IN}$ switches from a high level to a zero level, an energy level of a drain voltage of the feedback field-effect transistor is maintained in a low state to maintain a logic state based on the performed logical operation in a low state based on electrons and holes accumulated in a potential well of the channel region through the positive feedback loop.

5. The logic-in-memory inverter according to claim 4, wherein, in the feedback field-effect transistor, when the input voltage $V_{IN}$ increases to a high level from a zero level, a latch-up phenomenon occurs based on the positive feedback loop.

6. The logic-in-memory inverter according to claim 1, wherein:
when the input voltage $V_{IN}$ is at a low level, the logic-in-memory inverter determines a logic state based on the performed logical operation as a high state; and
when the input voltage $V_{IN}$ is at a high level, the logic-in-memory inverter determines the logic state based on the performed logical operation as a low state.

7. The logic-in-memory inverter according to claim 1, wherein:
when the input voltage $V_{IN}$ switches from a low level to a zero level, the logic-in-memory inverter maintains a logic state based on the performed logical operation in a high state; and
when the input voltage $V_{IN}$ switches from a high level to a zero level, the logic-in-memory inverter maintains the logic state based on the performed logical in a low state.

8. The logic-in-memory inverter according to claim 1, wherein:
the metal oxide semiconductor field-effect transistor is a p-type field-effect transistor; and
the feedback field-effect transistor is an n-type field-effect transistor.

9. The logic-in-memory inverter according to claim 8, wherein:
the metal oxide semiconductor field-effect transistor includes a p-n-p transistor including a drain region, a source region, and a channel region, a gate insulating layer, and a gate electrode;
the drain region and the source region are in a p-doped state; and
the channel region is in an n-doped state.

10. The logic-in-memory inverter according to claim 8, wherein:
the feedback field-effect transistor includes the nanostructure, a gate insulating layer, and a gate electrode;
the nanostructure is a p-n-p-n nanostructure and includes a drain region, a source region, a first channel region, and a second channel region;
the drain region and the second channel region are in a p-doped state;
the source region and the first channel region are in an n-doped state; and
a channel length of the first channel region is equal to a channel length of the second channel region.

* * * * *